United States Patent
Kirkpatrick et al.

(10) Patent No.: US 12,027,382 B2
(45) Date of Patent: Jul. 2, 2024

(54) SURFACE CLEANING WITH DIRECTED HIGH PRESSURE CHEMISTRY

(71) Applicant: Applied Materials, Inc., Santa Clara, CA (US)

(72) Inventors: Brian K. Kirkpatrick, Allen, TX (US); Ekaterina A. Mikhaylichenko, San Jose, CA (US); Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/541,540

(22) Filed: Dec. 3, 2021

(65) Prior Publication Data
US 2023/0178388 A1 Jun. 8, 2023

(51) Int. Cl.
*H01L 21/67* (2006.01)
*B08B 3/02* (2006.01)
*B24B 37/00* (2012.01)
*H01L 21/306* (2006.01)

(52) U.S. Cl.
CPC ........ *H01L 21/67051* (2013.01); *B08B 3/024* (2013.01); *B08B 3/02* (2013.01); *B24B 37/00* (2013.01); *H01L 21/30625* (2013.01)

(58) Field of Classification Search
CPC ......... H01L 21/67051; H01L 21/30625; B08B 3/024; B08B 3/02; B24B 37/00
See application file for complete search history.

(56) References Cited

U.S. PATENT DOCUMENTS

| | | | | |
|---|---|---|---|---|
| 3,902,513 A | * | 9/1975 | Franz | C03C 23/0075 134/172 |
| 3,931,790 A | * | 1/1976 | Franz | B08B 3/02 118/316 |
| 4,519,846 A | * | 5/1985 | Aigo | H01L 21/67051 134/33 |
| 5,348,033 A | * | 9/1994 | Levit | H05K 13/02 134/122 R |

(Continued)

FOREIGN PATENT DOCUMENTS

| CN | 202316390 U | 7/2012 |
|---|---|---|
| CN | 102755980 A | 10/2012 |

(Continued)

OTHER PUBLICATIONS

International Search Report and Written Opinion dated Nov. 3, 2022 in International Patent Application No. PCT/US2022/037250, 12 pages.

*Primary Examiner* — Benjamin L Osterhout
(74) *Attorney, Agent, or Firm* — Kilpatrick Townsend & Stockton LLP (57) ABSTRACT

Cleaning chambers may include a substrate support having a substrate seating position. The cleaning chambers may include a plurality of fluid nozzles facing the substrate support. Each fluid nozzle of the plurality of fluid nozzles may define a fluid port characterized by a leading edge and a trailing edge. Each fluid nozzle of the plurality of fluid nozzles may be angled relative to the substrate seating position of the substrate support to produce an interior angle of greater than or about 90° at an intersection location across the substrate seating position for a fluid delivered from each fluid nozzle at the leading edge of the fluid port.

20 Claims, 6 Drawing Sheets

(56) References Cited

U.S. PATENT DOCUMENTS

| | | | | |
|---|---|---|---|---|
| 5,349,978 | A | * | 9/1994 | Sago .................... B08B 3/02 |
| | | | | 134/902 |
| 5,616,069 | A | * | 4/1997 | Walker .................. B08B 3/02 |
| | | | | 15/88.1 |
| 5,779,522 | A | * | 7/1998 | Walker ................. B08B 3/022 |
| | | | | 134/143 |
| 5,868,608 | A | * | 2/1999 | Allman ................. B24B 1/04 |
| | | | | 451/72 |
| 6,280,299 | B1 | | 8/2001 | Kennedy et al. |
| 9,833,876 | B2 | * | 12/2017 | Chan ................... B24B 37/34 |
| 10,460,926 | B2 | | 10/2019 | Peng et al. |
| 2008/0017320 | A1 | * | 1/2008 | Choi .................. H01L 21/6776 |
| | | | | 156/345.54 |
| 2014/0230860 | A1 | * | 8/2014 | Chua ................ H01L 21/02052 |
| | | | | 134/144 |
| 2017/0053794 | A1 | | 2/2017 | Kim et al. |
| 2019/0189470 | A1 | * | 6/2019 | Park ................ H01L 21/02057 |
| 2020/0306931 | A1 | | 10/2020 | Lianto et al. |
| 2021/0272820 | A1 | | 9/2021 | Ishibashi |

FOREIGN PATENT DOCUMENTS

| | | | |
|---|---|---|---|
| KR | 20130090209 | A | 8/2013 |
| TW | 202023697 | A | 7/2020 |

* cited by examiner

SURFACE CLEANING WITH DIRECTED HIGH PRESSURE CHEMISTRY

TECHNICAL FIELD

The present technology relates to semiconductor systems, processes, and equipment. More specifically, the present technology relates to high-pressure substrate cleaning processes and equipment.

BACKGROUND

Chemical-mechanical polishing, among other processing operations, is commonly used in semiconductor processing to planarize or polish layers of material formed over a semiconductor substrate. In typical processing, a substrate is pressed against a rotating polishing pad on which a polishing slurry is flowed. Material formed along the substrate is removed through a combination of chemical interaction of the polishing slurry and mechanical interaction with the polishing pad. As particle incorporation becomes a greater challenge to further scaling for chemical-mechanical polishing and other processes, substrate cleaning may be insufficient during fabrication.

Thus, there is a need for improved systems and methods that can be used to improve systems for cleaning and increased particle removal. These and other needs are addressed by the present technology.

SUMMARY

Cleaning chambers may include a substrate support having a substrate seating position. The cleaning chambers may include a plurality of fluid nozzles facing the substrate support. Each fluid nozzle of the plurality of fluid nozzles may define a fluid port characterized by a leading edge and a trailing edge. Each fluid nozzle of the plurality of fluid nozzles may be angled relative to the substrate seating position of the substrate support to produce an interior angle of greater than or about 90° at an intersection location across the substrate seating position for a fluid delivered from each fluid nozzle at the leading edge of the fluid port.

In some embodiments, each fluid nozzle may be operable to deliver a fluid at greater than or about 500 psi. The plurality of fluid nozzles may be a first plurality of fluid nozzles, and the cleaning chamber may include a second plurality of fluid nozzles. The first plurality of fluid nozzles may be directed towards the substrate seating position in a first direction. The second plurality of fluid nozzles may be directed towards the substrate seating position in a second direction opposite the first direction. Each fluid nozzle of the first plurality of fluid nozzles may be separated from each adjacent fluid nozzle of the first plurality of fluid nozzles by a gap. Each fluid nozzle of the second plurality of fluid nozzles may be positioned in line with a gap between two fluid nozzles of the first plurality of fluid nozzles. Each fluid nozzle of the first plurality of fluid nozzles may be disposed along a line in a first direction across the cleaning chamber. Each fluid nozzle of the second plurality of fluid nozzles may be disposed along a line in a second direction across the cleaning chamber normal to the first direction. The cleaning chambers or system may include a first cleaning fluid reservoir fluidly coupled with the first plurality of fluid nozzles within the cleaning chamber. The cleaning chambers or system may include a second cleaning fluid reservoir fluidly coupled with the second plurality of fluid nozzles within the cleaning chamber. The first cleaning fluid reservoir may include a first cleaning fluid, and the second cleaning fluid reservoir may include a second cleaning fluid different from the first cleaning fluid. Each fluid port may be characterized by a slit opening.

Some embodiments of the present technology may encompass methods of substrate cleaning. The methods may include positioning a substrate in a substrate cleaning chamber. The methods may include spraying a cleaning fluid at the substrate from a plurality of fluid nozzles within the substrate cleaning chamber, wherein each fluid nozzle of the plurality of fluid nozzles is angled relative to the substrate so an interior angle between the cleaning fluid and the substrate along a leading edge of delivery from each fluid nozzle is greater than or about 90°.

In some embodiments, the methods may include rotating the substrate within the substrate cleaning chamber while spraying the cleaning fluid. The cleaning fluid may be sprayed at a fluid pressure of less than or about 250 psi. The methods may include reversing the direction of rotation. The methods may include continuing to spray the cleaning fluid at the substrate. The cleaning fluid may be sprayed at a fluid pressure of greater than or about 500 psi. The cleaning fluid may be or include deionized water, hydrofluoric acid, or ammonium hydroxide. The cleaning fluid may include a first cleaning fluid, and the method may include halting spray of the first cleaning fluid. The method may include spraying a second cleaning fluid at the substrate. The plurality of fluid nozzles may be a first plurality of fluid nozzles, and the second cleaning fluid may be sprayed from a second plurality of fluid nozzles. Each fluid nozzle of the first plurality of fluid nozzles may be disposed along a line in a first direction across the substrate cleaning chamber. Each fluid nozzle of the second plurality of fluid nozzles may be disposed along a line in a second direction across the substrate cleaning chamber normal to the first direction.

Some embodiments of the present technology may encompass cleaning chambers. The cleaning chambers may include a substrate support comprising a substrate seating position. The cleaning chambers may include a plurality of fluid nozzles facing the substrate support. Each fluid nozzle of the plurality of fluid nozzles may define a fluid port characterized by a spray angle having a spray leading edge and a spray trailing edge. Each fluid nozzle of the plurality of fluid nozzles may be angled relative to the substrate seating position of the substrate support so the spray leading edge of the spray angle of the fluid port of each fluid nozzle of the plurality of fluid nozzles intersects a location across the substrate seating position at an interior angle of greater than or about 90°. In some embodiments, the substrate support may include a rotatable drum. The plurality of fluid nozzles may be coupled along a sidewall of the cleaning chamber outside of the rotatable drum. Each fluid nozzle may be operable to deliver a fluid at greater than or about 500 psi.

Such technology may provide numerous benefits over conventional systems and techniques. For example, the cleaning systems may allow cost-effective processing that may quickly reduce particle contamination across multiple substrate surfaces. Additionally, the present technology may reduce particle counts on any number of substrates that may be processed in several ways. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing may involve the formation and removal of materials to produce any number of structures. During processing, particle generation and contamination may affect interfacial layer compatibility as well as layer formation quality. Chemical-mechanical polishing or any other type of polishing or removal may be performed to produce relatively planar surfaces, such as within system tolerances, although the operations may introduce any number of particles. Brush scrubbers may be used to remove residual material from the polishing operations, although conventional brush scrubbing may be limited in the particle sizes able to be removed, and may also introduce additional particulate material from the scrubbers. Brush scrubbing also faces the limitation of the brush becoming a consumable, thereby having a variable cleaning efficiency over the brush lifetime as well as requiring tool downtime for end of life replacement. Accordingly, particle contamination may continue to be a barrier to further scaling for any number of semiconductor, solar, or display fabrication processes.

Other conventional cleaning systems may similarly suffer from insufficient cleaning. For example, spray cleaning in conventional technology is often performed at low pressure with spray nozzles oriented directly in line with a substrate to be cleaned. The lower pressure is used to limit any impact on device features, which may otherwise cause pattern collapse. This may, however, cause a number of issues for substrate cleaning. For example, the low pressure may allow certain large particles to be removed from the substrate, but may not have sufficient force to remove smaller particulate matter. Additionally, spray nozzles oriented directly perpendicular to the substrate surface to be cleaned may introduce several challenges. In addition to requiring longer cleaning times, the interaction of fluid patterns sprayed on the substrates may cause eddy currents to form between interacting fluid streams from adjacent nozzles. While large particles may be removed, the interaction may reduce the force of flowing fluid, which may be incapable of overcoming Van der Waals forces between the substrate and smaller particles, or may allow smaller particles to be reattached at secondary positions due to the eddying formed across the substrate being cleaned. Accordingly, conventional technologies have been incapable of improving substrate cleaning and particle removal.

The present technology overcomes these issues with conventional scrubbing and cleaning systems by providing cleaning systems with specifically angled nozzles to produce fluid flow patterns that may increase particle removal and reduce nozzle interactions. Additionally, the present technology may utilize increased fluid pressure, which may improve particle removal across surfaces to be cleaned. The present technology may utilize one or more fluids to adjust zeta potential between the cleaning fluid and particles across the substrate surface, which may alter particle and substrate charge to facilitate removal and ease of overcoming Van der Waals attractive forces between the particles and substrate surface both at initial positions and during transfer from a substrate.

Although the remaining disclosure will routinely identify specific semiconductor processes utilizing the disclosed technology, it will be readily understood that the systems and methods are equally applicable to a variety of other substrates for cleaning, including display panels, solar panels, or any other substrate where particle removal may be beneficial. Accordingly, the technology should not be considered so limited as for use with the described substrates and processes alone. The disclosure will discuss one possible system with which the present technology may be used before describing systems and methods or operations of exemplary process sequences according to some embodiments of the present technology. It is to be understood that the technology is not limited to the equipment described, and processes discussed may be performed in any number of processing chambers and systems, along with any number of modifications, some of which will be noted below.

Figure 1:
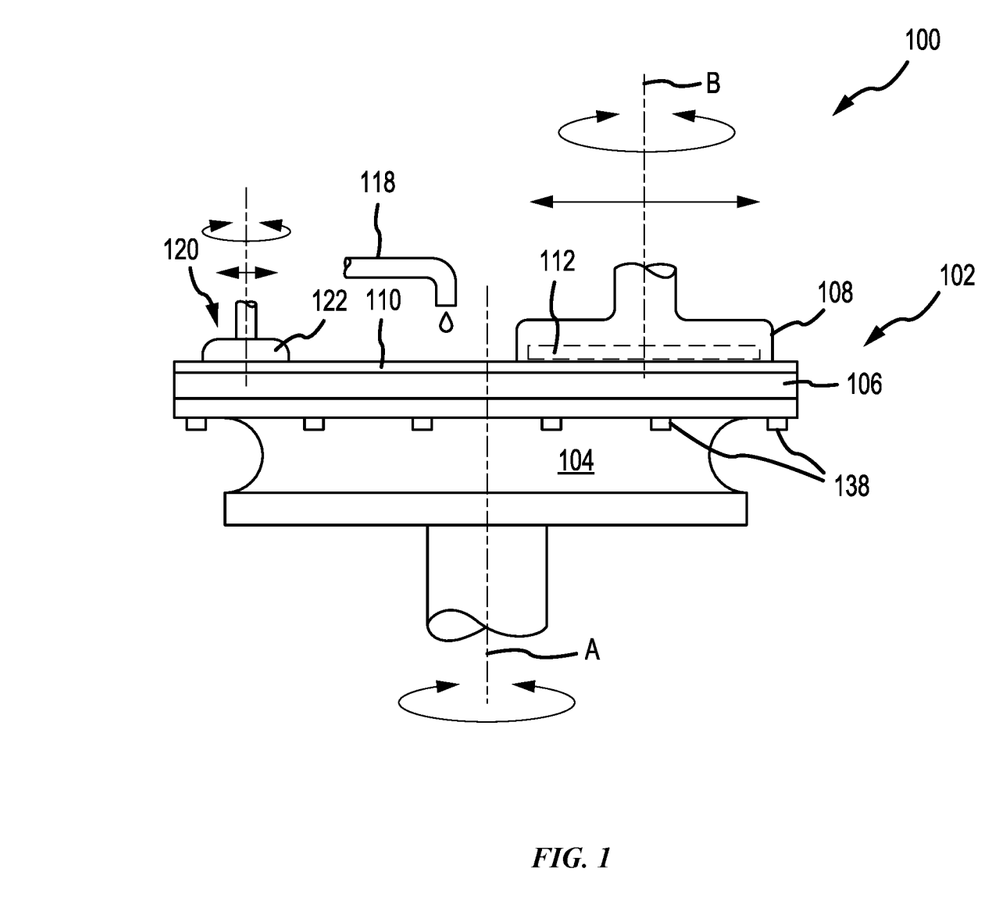
FIG. 1 shows a schematic cross-sectional view of an exemplary processing system according to some embodiments of the present technology.

FIG. 1 shows a schematic cross-sectional view of an exemplary polishing system 100 according to some embodiments of the present technology. Polishing system 100 includes a platen assembly 102, which includes a lower platen 104 and an upper platen 106. Lower platen 104 may define an interior volume or cavity through which connections can be made, as well as in which may be included end-point detection equipment or other sensors or devices, such as eddy current sensors, optical sensors, or other components for monitoring polishing operations or components. For example, and as described further below, fluid couplings may be formed with lines extending through the lower platen 104, and which may access upper platen 106 through a backside of the upper platen. Platen assembly 102 may include a polishing pad 110 mounted on a first surface of the upper platen. A substrate carrier 108, or carrier head, may be disposed above the polishing pad 110 and may face the polishing pad 110. The platen assembly 102 may be rotatable about an axis A, while the substrate carrier 108 may be rotatable about an axis B. The substrate carrier may also be configured to sweep back and forth from an inner radius to an outer radius along the platen assembly, which may, in part, reduce uneven wear of the surface of the polishing pad 110. The polishing system 100 may also include a fluid delivery arm 118 positioned above the polishing pad 110, and which may be used to deliver polishing fluids, such as a polishing slurry, onto the polishing pad 110. Additionally, a pad conditioning assembly 120 may be disposed above the polishing pad 110, and may face the polishing pad 110.

In some embodiments of performing a chemical-mechanical polishing process, the rotating and/or sweeping substrate carrier 108 may exert a downforce against a substrate 112, which is shown in phantom and may be disposed within or coupled with the substrate carrier. The downward force applied may depress a material surface of the substrate 112 against the polishing pad 110 as the polishing pad 110 rotates about a central axis of the platen assembly. The interaction of the substrate 112 against the polishing pad 110 may occur in the presence of one or more polishing fluids delivered by the fluid delivery arm 118. A typical polishing fluid may include a slurry formed of an aqueous solution in which abrasive particles may be suspended. Often, the polishing fluid contains a pH adjuster and other chemically active components, such as an oxidizing agent, which may enable chemical mechanical polishing of the material surface of the substrate 112.

The pad conditioning assembly 120 may be operated to apply a fixed abrasive conditioning disk 122 against the surface of the polishing pad 110, which may be rotated as previously noted. The conditioning disk may be operated against the pad prior to, subsequent, or during polishing of the substrate 112. Conditioning the polishing pad 110 with the conditioning disk 122 may maintain the polishing pad 110 in a desired condition by abrading, rejuvenating, and removing polish byproducts and other debris from the polishing surface of the polishing pad 110. Upper platen 106 may be disposed on a mounting surface of the lower platen 104, and may be coupled with the lower platen 104 using a plurality of fasteners 138, such as extending through an annular flange shaped portion of the lower platen 104.

The polishing platen assembly 102, and thus the upper platen 106, may be suitably sized for any desired polishing system, and may be sized for a substrate of any diameter, including 200 mm, 300 mm, 450 mm, or greater. For example, a polishing platen assembly configured to polish 300 mm diameter substrates, may be characterized by a diameter of more than about 300 mm, such as between about 500 mm and about 1000 mm, or more than about 500 mm. The platen may be adjusted in diameter to accommodate substrates characterized by a larger or smaller diameter, or for a polishing platen 106 sized for concurrent polishing of multiple substrates. The upper platen 106 may be characterized by a thickness of between about 20 mm and about 150 mm, and may be characterized by a thickness of less than or about 100 mm, such as less than or about 80 mm, less than or about 60 mm, less than or about 40 mm, or less. In some embodiments, a ratio of a diameter to a thickness of the polishing platen 106 may be greater than or about 3:1, greater than or about 5:1, greater than or about 10:1, greater than or about 15:1, greater than or about 20:1, greater than or about 25:1, greater than or about 30:1, greater than or about 40:1, greater than or about 50:1, or more.

The upper platen and/or the lower platen may be formed of a suitably rigid, light-weight, and polishing fluid corrosion-resistant material, such as aluminum, an aluminum alloy, or stainless steel, although any number of materials may be used. Polishing pad 110 may be formed of any number of materials, including polymeric materials, such as polyurethane, a polycarbonate, fluoropolymers, polytetrafluoroethylene polyphenylene sulfide, or combinations of any of these or other materials. Additional materials may be or include open or closed cell foamed polymers, elastomers, felt, impregnated felt, plastics, or any other materials that may be compatible with the processing chemistries. It is to be understood that polishing system 100 is included to provide suitable reference to components discussed below, which may be incorporated in system 100, although the description of polishing system 100 is not intended to limit the present technology in any way, as embodiments of the present technology may be incorporated in any number of polishing systems that may benefit from the components and/or capabilities as described further below.

Figure 2:
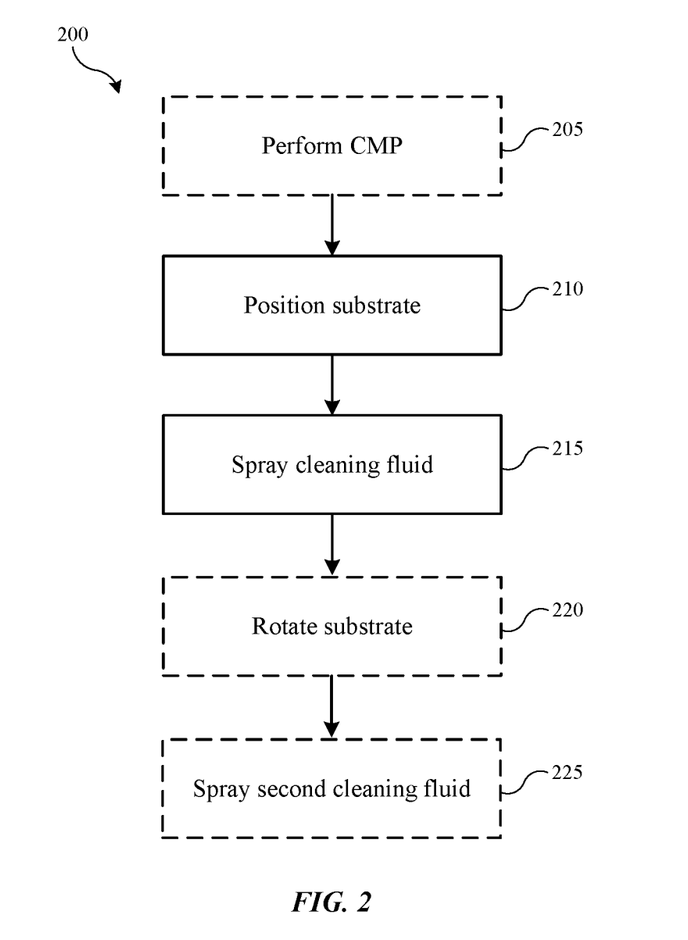
FIG. 2 shows selected operations in a method of processing according to some embodiments of the present technology.

Polishing assemblies described above and according to embodiments of the present technology may be used in methods of substrate cleaning according to some embodiments of the present technology. The polishing operations may introduce any number of particles including from the slurry, the mounting surface, and the polishing pad. As explained above, chemical-mechanical polishing may not necessarily be performed prior to performing operations of substrate cleaning according to some embodiments of the present technology, which may be applicable to a number of substrate cleaning processes. However, particle generation from polishing or other operations may leave a number of particles of a variety of sizes along multiple surfaces of the substrate. FIG. 2 shows selected operations in a method 200 of substrate cleaning according to some embodiments of the present technology. Method 200 may include one or more operations prior to the initiation of the stated method operations, including processing to develop one or more layers of material on a semiconductor, display, or other substrates, as well as any number of processes to remove or develop features on a substrate. The processes may develop particulate matter that may be exposed across the substrate, as well as attached to a backside of the substrate in some embodiments.

Some embodiments may optionally include a process that performs a chemical-mechanical polishing process at optional operation 205, and which may provide a substantially planar surface across the substrate, although it is to be understood that planar surfaces to be cleaned may be provided by any number of methods. By planarity is meant a relatively flat surface, such as within the tolerance of a process utilized to produce the planarity, including chemical-mechanical polishing, for example. Additionally, in some embodiments an exposed surface of the substrate may be characterized by any number of topographies, which may be produced by any processing or fabrication method. At operation 210, method 200 may include positioning the substrate within a cleaning chamber, which may include a substrate support including a substrate seating position. Exemplary cleaning chambers may be described in more detail below.

At operation 215, method 200 may include spraying a cleaning fluid across the substrate. The fluid may be delivered from a plurality of nozzles, which may extend across one or more portions of the chamber. As will be described in further detail below, fluid nozzles according to some embodiments of the present technology may be angled relative to the substrate surface, which may improve cleaning processes. In some embodiments, the substrate may be rotated within the cleaning chamber relative to the nozzles at optional operation 220, or otherwise translated in one or more directions to improve surface cleaning. Depending on the direction of rotation, concepts of leading and trailing edges may be reversed from what is noted, and it is to be understood that either edge may be leading or trailing in some embodiments depending on the direction of rotation relative to the angling of the fluid nozzles. Additionally, the fluid nozzles may be translated laterally within the chamber to further improve substrate surface cleaning and exposure, such as by moving a span from which the fluid nozzles extend. In some embodiments, the spraying operation utilizing a first cleaning fluid may be halted, and a second cleaning fluid may be sprayed or otherwise delivered at optional operation 225, and which may be delivered from the same or different fluid nozzles within the processing chamber. Any number of additional fluid deliveries may also be performed. Several aspects of cleaning method 200 may be performed to improve cleaning and processing throughput, and will be described in detail below. It is to be understood that any aspect as described below may be applied in method 200, or any other method of cleaning utilizing aspects of the present technology.

Figure 3:
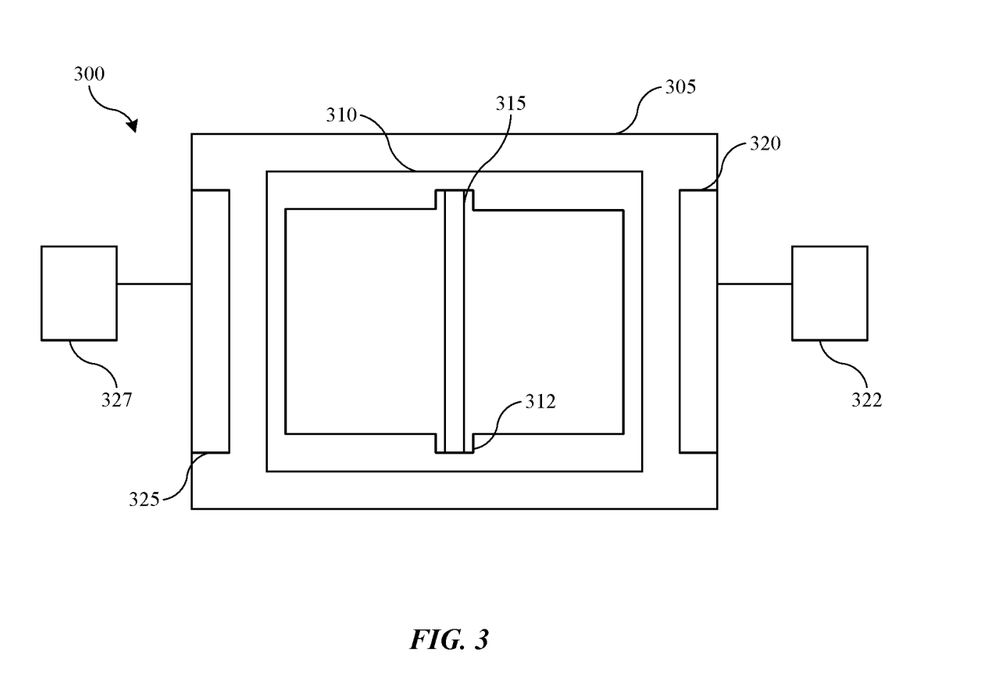
FIG. 3 shows a schematic cross-sectional view of an exemplary cleaning system according to some embodiments of the present technology.

FIG. 3 shows a schematic cross-sectional view of an exemplary cleaning system 300 according to some embodiments of the present technology, although processes according to embodiments of the present technology may be performed in a variety of chambers and systems. Cleaning system 300 illustrates an exemplary system in which a substrate may be cleaned along one or more surfaces, while being positioned in a vertical orientation, facilitating gravity removal of fluids being delivered. It is to be understood that multiple adjustments may be made to the system in embodiments, including having a chamber in which the substrate is positioned horizontally, and or chucked to a substrate support. Methods according to some embodiments of the present technology, including method 200, may be performed in system 300 or alternative systems having one or more of the components discussed throughout the present application. It is to be understood that cleaning system 300 is not shown to any particular scale, and is shown only to illustrate components that may be included in some embodiments. It is to be understood that components may be spaced closer or further from one another to provide the effects or scaling as discussed throughout the present disclosure.

Cleaning system 300 may include a chamber body 305, which may allow vertical orientation of a substrate within the chamber, although in some embodiments the chamber may be oriented so the wafer seats horizontally, with fluid delivered from above and/or below. In some embodiments, the chamber body may include a drum 310 disposed within the chamber body 305, and which may include or define a substrate seat 312 allowing a substrate 315 to be disposed or seated within the cleaning chamber. In some embodiments drum 310 may be rotatable within the chamber body 305, which may facilitate cleaning operations as previously described, and which may allow stationary fluid delivery while rotating the substrate. Substrate 315 may be characterized by any dimensions previously described, and may also include rectangular dimensions, such as for display, solar, or other panel substrate configurations.

Depending on the substrate and cleaning operations, drum 310 may define the substrate seating to allow exposure of the substrate along opposite surfaces, which may allow a processed surface, or a surface on which formation or removal has occurred, and a backside surface to be cleaned simultaneously according to some embodiments of the present technology. Additionally, a drum or substrate support may include a substrate seating surface, which may allow the substrate to be clamped, such as with vacuum or electrostatic chucking, in some embodiments of the present technology. When configured for rotation, drum 310 or a substrate support may be operable to rotate at any speed, including speeds to accommodate cleaning operations and spin or drying operations. Additionally, drum 310 may rotate about an axis that allows an elliptical path, and which may afford lateral movement as well as rotational movement to improve cleaning exposure across the substrate.

Cleaning system 300 may also include a fluid delivery apparatus 320, and may include a second fluid delivery apparatus 325 in some embodiments of the present technology. Fluid delivery apparatus 320 or 325 may include a plurality of fluid nozzles as will be described below, and which may deliver or spray one or more cleaning fluids across the substrate. Fluid delivery apparatus 320 may be fluidly coupled with a first fluid reservoir 322, which may deliver one or more fluids to one or more plurality of nozzles of the fluid delivery apparatus 320. Similarly, fluid delivery apparatus 325 may be fluidly coupled with a second fluid reservoir 327, which may deliver one or more fluids to one or more plurality of nozzles of the fluid delivery apparatus 325. As will be described below, the fluid nozzles may be distributed in one or more patterns within the chamber body 305, and may or may not be translatable in embodiments of the present technology. For example, the fluid nozzles may extend from a span that may be rotated or laterally translated in some embodiments, although in some embodiments the nozzles or span may be fixed within the chamber body, which may limit additional particle generation from moving components within the cleaning chamber.

Figure 4:
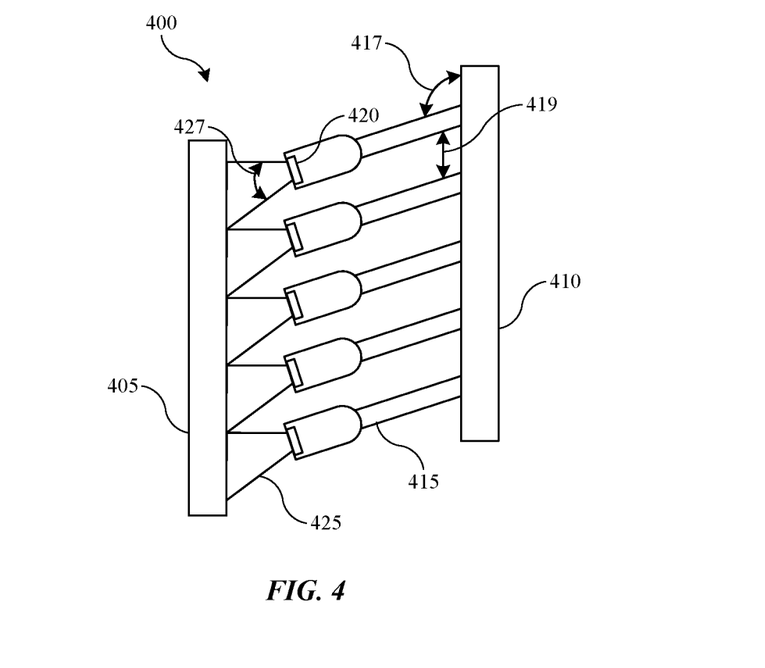
FIG. 4 shows a schematic view of an exemplary cleaning nozzle arrangement according to some embodiments of the present technology.

FIG. 4 shows a schematic view of an exemplary cleaning nozzle arrangement 400 according to some embodiments of the present technology, and may illustrate details of a fluid delivery apparatus as previously described. A substrate 405 is included, and may be any substrate to be cleaned, and which may be seated, positioned, or housed within a cleaning chamber incorporating one or more cleaning nozzle arrangements 400. Although illustrated in a vertical orientation, it is to be understood that the system may be disposed horizontally in embodiments encompassed by the present technology. Additionally, although the nozzles are illustrated in a vertical orientation, the nozzles may also be disposed across the chamber on a horizontal span, and may be illustrated without a particular orientation or direction. Similarly, for embodiments in which the substrate may be rotated, the figure may illustrate a configuration and/or nozzle orientation in which the substrate 405 may be rotated in either direction into or out of the page. The cleaning nozzles may be included in a cleaning system as discussed above, or any other cleaning system, and may be used to perform cleaning processes as discussed previously. The present technology may provide a cleaning nozzle setup with specifically angled nozzles allowing improved flow and cleaning across a substrate, and which may limit eddy current formation or interference across the substrate. As illustrated, the arrangement may include a span 410 or bridge, which may be coupled with a fluid reservoir as discussed above, and which may include one or more channels along or within the span for fluid delivery to one or more fluid nozzles 415.

Fluid nozzles 415 may extend from the span 410 at an angle 417, and may face the substrate. The nozzles may extend to direct the nozzles to be oriented away from a normal position relative to the substrate 405. Any number of fluid nozzles may be disposed along the span, and may be spaced to include any gap 419 between fluid nozzles. Additionally, the number of fluid nozzles included may depend on the size and shape of substrates to be cleaned. Each fluid nozzle may define or include a fluid port 420, which may define a fluid spray 425 to the substrate. Although fluid port 420 may be an aperture or rounded shape, in some embodiments fluid port 420 may define a slit or slot, such as a rectangular opening, and which may provide a flat fluid spray 425 to the substrate. Any number of aperture or fluid port designs are encompassed by the present technology, and which may be used to adjust fluid spray pressure and profile as fluid is delivered to the substrate.

As will be explained further below, in some embodiments the fluid nozzles may be angled to provide a specific spray profile along the substrate surface. For example, the fluid ports may define a pattern for fluid spray 425, including a spray angle 427, which may also be influenced by the pressure at which cleaning fluid may be delivered through the system. Although any spray angle 427 may be encompassed by the present technology, fluid nozzles 415 according to some embodiments may provide a spray angle of less than or about 60°, and may provide a spray angle of less than or about 55°, less than or about 50°, less than or about 45°, less than or about 40°, less than or about 35°, less than or about 30°, less than or about 25°, less than or about 20°, less than or about 15°, less than or about 10°, or less. In some embodiments, the spray angle provided to be greater than or about 10°, greater than or about 15°, or greater, which may reduce the number of nozzles used to provide coverage across a substrate surface. By maintaining a relatively smaller spray angle, the force across the substrate corresponding to the spray may be more uniform for an angled pattern, which may improve cleaning efficiency in encompassed systems. In some embodiments, angle 417 may be similar to the spray angle, or may be a portion of the spray angle, such as half, added in one direction from a normal orientation, which may align the nozzle to direct a leading edge of the fluid spray as will be described further below.

Figure 5:
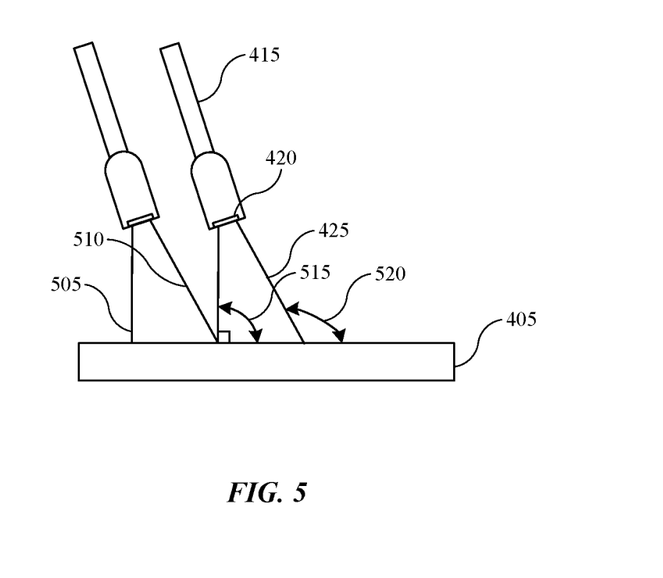
FIG. 5 shows a schematic view of exemplary nozzle angling according to some embodiments of the present technology.

The orientation of the nozzles and the spray angle of delivery may affect an impact pattern across the substrate. The present technology may orient the nozzles to provide a spray pattern configured to limit or prevent interaction between fluid sprays from adjacent nozzles by limiting countervailing flow between nozzles. FIG. 5 shows a schematic view of exemplary nozzle angling according to some embodiments of the present technology, and may illustrate additional details of aspects of the cleaning nozzle arrangement described above. Again, although shown in a horizontal orientation, the figure may encompass aspects in any orientation. Additionally, for embodiments in which the substrate may be rotated, the figure may illustrate a configuration and/or nozzle orientation in which the substrate may be rotated in either direction into or out of the page. As discussed above, each fluid nozzle may provide a spray pattern 425 characterized by a spray angle. The fluid port 420 and/or the fluid spray 425 may be characterized by a leading edge 505, which may be characterized by a shorter distance to the substrate, and a trailing edge 510, which may be characterized by a longer distance to the substrate, of fluid spray delivery towards the substrate. In some embodiments of the present technology, each fluid nozzle may be angled relative to the substrate 405, or the seating position for a substrate within a corresponding cleaning chamber, to produce an interior angle 515 at the leading edge of greater than or about 90°. For example, as illustrated, each nozzle is angled so interior angle 515 is 90° at the intersection between the leading edge of the fluid port or fluid being delivered and the location across the substrate 405 where the fluid at the leading edge contacts the substrate.

When fluid nozzles are positioned normal to the substrate surface, without angle or directly facing the substrate, the fluid spray will contact the substrate and spread in each direction, such as opposite lateral directions, or about all directions in a cone. An adjacent fluid nozzle similarly oriented will deliver fluid back against the flowing fluid from the first nozzle, which may cause a reduction in force between the flows, and development of eddy currents across the substrate, as well as the potential for stagnation of flow at certain locations. Because particles may have attraction to the surface, such as Van der Waals forces, the stagnation may prevent the particles from being dislodged. Additionally, for particles that may be initially dislodged, flow that extends to an eddy location or another point of stagnation may allow the particle to be re-attracted to the surface, and the force of attraction may be sufficient to relodge the particles. The present technology provides fluid nozzles angled, and delivering fluid in controlled patterns, to limit or prevent interfering flow between nozzles, which may ensure a more similar flow and force of flow across the substrate. This may facilitate both dislodging particles from the substrate, and may maintain sufficient force in flow patterns to ensure the particles are fully removed from the surface.

Although an amount of impact flow may cause a certain amount of interaction between fluid streams, increased force at a leading edge may overcome counterflow at a trailing edge of a reduced stream, and which may limit any effect on the flow pattern, especially at fluid pressures as will be discussed below. Due to tolerances both in flow and installation, the angle may overlap less than or about 2° to limit interaction, although in embodiments the angle relative to the substrate at the leading edge may necessarily be greater than or about 85°, and may be greater than or about 88°, greater than or about 89°, greater than or about 90°, greater than or about 92°, greater than or about 94°, greater than or about 96°, greater than or about 98°, greater than or about 100°, greater than or about 105°, greater than or about 110°, greater than or about 115°, greater than or about 120°, or more.

The exterior angle 520 at the trailing edge may also be controlled by the distance the nozzles are disposed from the substrate. In some embodiments, the exterior angle 520 may be controlled to be less than or about 160°, and may be maintained at less than or about 155°, less than or about 150°, less than or about 145°, less than or about 140°, less than or about 135°, less than or about 130°, less than or about 125°, less than or about 120°, less than or about 115°, less than or about 110°, less than or about 105°, less than or about 100°, or less. By controlling the distance to the substrate, and maintaining lower exterior angle, the force being applied at the trailing edge may be closer to the force applied at the leading edge, which may provide more uniform cleaning in some embodiments of the present technology.

To facilitate particle removal across the substrate, in some embodiments the cleaning fluid may be delivered at a pressure from each fluid nozzle of greater than or about 200 psi, and may be delivered at a pressure of greater than or about 250 psi, greater than or about 300 psi, greater than or about 350 psi, greater than or about 400 psi, greater than or about 450 psi, greater than or about 500 psi, greater than or about 550 psi, greater than or about 600 psi, greater than or about 650 psi, greater than or about 700 psi, or more. In embodiments where a chemical-mechanical polishing process has been performed previously, or where a substantially planar surface is otherwise formed, the pressure may be maintained at greater than or about 500 psi. Where a number of features are formed across the substrate, higher pressures may cause damage or pattern collapse. However, some embodiments of the present technology may specifically be performed on substrates characterized by a substantially planar profile, within the tolerance of the previous operation. This may allow increased fluid pressures, which may further reduce and remove particles from contaminating surfaces of the substrate. Additionally, in some embodiments, a first surface may be cleaned by delivering a fluid at a first fluid pressure, and a second surface opposite the first surface may be cleaned by delivering a fluid at a second fluid pressure different from the first, which may account for different topographies or materials exposed across the surfaces.

Fluids utilized as cleaning fluids according to some embodiments of the present technology may include any fluid or etchant material that may be sprayed as previously described. For example, cleaning fluids may include deionized water, an acidic fluid, such as hydrofluoric acid, basic fluids, such as ammonium hydroxide, or any other materials as would be appreciated by the skilled artisan. In some embodiments an acid or basic solution may be diluted to limit an effect on structures being cleaned. For example, hydrofluoric acid may be diluted with deionized water to less than or about 500:1, less than or about 700:1, less than or about 800:1, less than or about 900:1, or less than or about 1000:1, which may reduce an amount of etching that may occur to exposed materials or features across the substrate.

Any of these materials may be delivered alone, or in some combination, to perform a cleaning process. As one non-limiting example, a higher pressure deionized water spray may be delivered to initially clean the substrate of larger particles for a first period of time. An acidic or basic fluid may then be delivered at the same or different pressure for a second period of time, which may facilitate smaller particle removal. A subsequent deionized water spray and drying operation may then be performed to remove the acid or base material and clear the substrate. Any other combination or sequence is similarly encompassed by the present technology. By utilizing different materials, removal may be further tuned to influence the zeta potential, which may adjust the charge of particles across the substrate and the surface charge of the substrate itself. By utilizing different fluids characterized by different potential, particle charge may be adjusted to be closer to the surface charge, and attractive forces may be reduced, or the particles may be more likely repelled from the surface, which may further improve removal of small particles.

Figure 6:
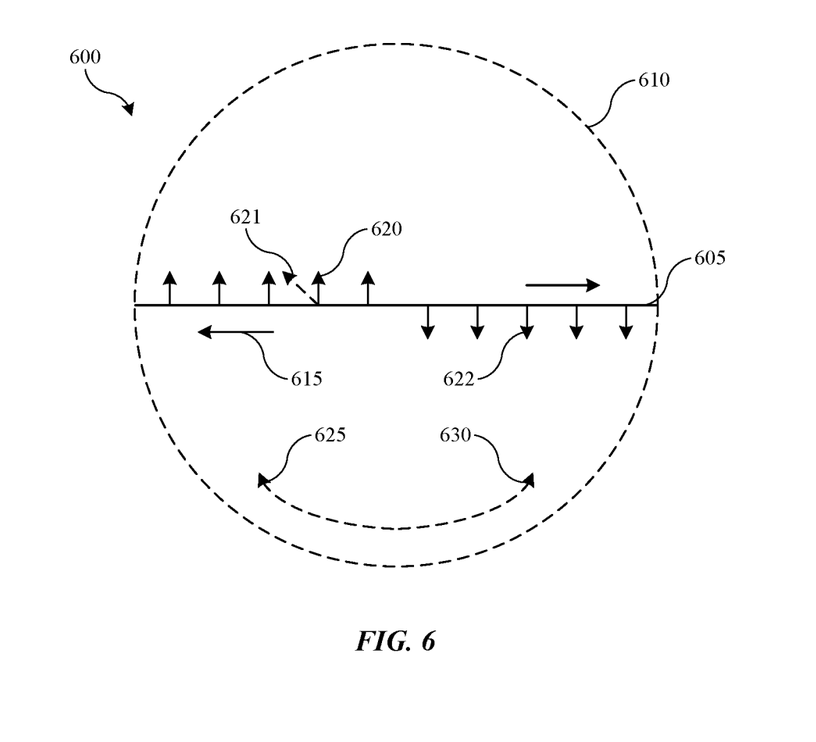
FIG. 6 shows a schematic view of exemplary nozzle orientations according to some embodiments of the present technology.

The present technology may also include additional aspects related to the nozzles and fluid delivery, which may further improve cleaning or reduce cleaning time according to some embodiments of the present technology. FIG. 6 shows a schematic view of exemplary nozzle orientation 600 according to some embodiments of the present technology. As illustrated, a span 605 having a plurality of nozzles may be shown in relation to an exemplary or conceptual substrate 610. As illustrated, nozzles according to some embodiments of the present technology may be angled in a second direction as well as a first direction in some embodiments of the present technology. For example, fluid nozzles may be angled along span 605 along direction 615, which may illustrate the fluid nozzle angling relative to the substrate surface as previously described.

Additionally, fluid nozzles may also be angled along span 605 along direction 620, which may direct fluid with or against a rotating substrate. Direction 620 may be produced by angling the fluid nozzles at any of the angles previously described, including any angle of orientation like angle 417 discussed above. Although direction 620 illustrates orientation in a straight line, it is to be understood that each arrow may be oriented further along the direction as previously described, which may provide the two angles of orientation as would be readily appreciated by the skilled artisan. Additionally, the figure illustrates embodiments including a first plurality of fluid nozzles oriented in direction 620, and a second plurality of fluid nozzles oriented in the opposite direction 622. About the midpoint of the span 605, in some embodiments the nozzle orientation may be reversed as illustrated, which may ensure consistent flow across the substrate for rotating substrates, although the setup may also be used for other systems that may not include rotation of the substrate. Direction 620 and opposite direction 622 are illustrated as being angled normal to the span 605, but it is to be understood that the nozzle angle may also be offset from normal, and may be angled in multiple directions from the span, as well as along the span as discussed above. For example, nozzles may be angled along direction 621, which may be offset from normal, and may angle to any degree, and in either direction away from the span, which may further tune particle removal and flow characteristics across the substrate.

As shown, substrate 610 may be rotated in either direction. When rotated in direction 625, the fluid spray along direction 620 may have a reduced impact on the substrate, as it will be delivered in a complementary direction with the rotation. Additionally, when the substrate is rotated in direction 630, the fluid spray along direction 630 may have an increased impact on the substrate, as it will be delivered in the opposite direction as rotation. Depending on the fluid pressure, material exposed on the substrate, and the amount of force required for particle removal, rotation of a substrate, and nozzle angling may both facilitate cleaning, and control fluid flow across a substrate. Moreover, in some embodiments the angle of the fluid nozzles may change based on the location of the fluid nozzle relative to a local position on the substrate. For example, in some embodiments, each fluid nozzle extending from the center outward may be angled along an increasing or decreasing angled gradient, and may include nozzles angled in any direction in any of the ranges of angles discussed previously. This may allow additional control of fluid flow based on angular momentum differences at locations nearer to the center of the substrate compared to locations nearer to exterior edges of the substrate.

Figure 7:
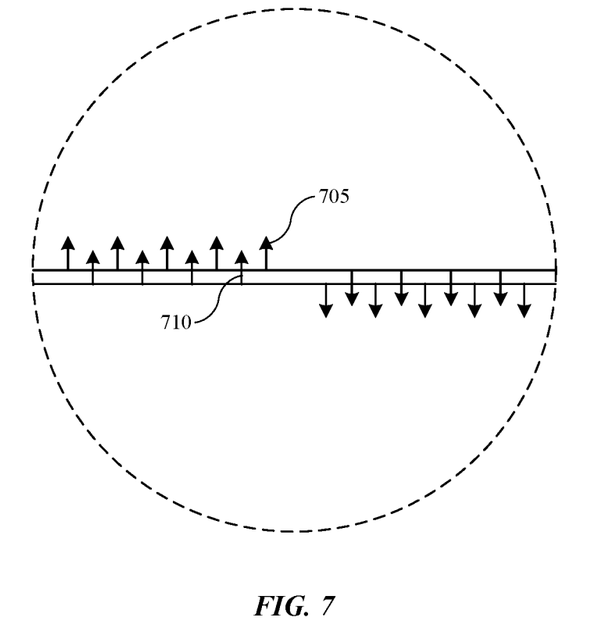
FIG. 7 shows a schematic view of exemplary nozzle orientations according to some embodiments of the present technology.

FIG. 7 shows a schematic view of exemplary nozzle orientations according to some embodiments of the present technology, and may illustrate configurations incorporating a first plurality of fluid nozzles 705 and a second plurality of fluid nozzles 710, both shown as the direction in which fluid delivery may occur, such as along a second angle, and which may be augmented by a first angle as previously described. As shown previously in FIG. 4, depending on the angle or orientation, fluid pressure, and gap distance between nozzles, the fluid pressure across the substrate surface may be more or less uniform. FIG. 7 shows a configuration where each fluid nozzle is separated from an adjacent fluid nozzle by a gap. A second fluid line may be provided through the span, and which may be delivering the same or a different cleaning fluid, and may deliver the fluid through the second plurality of fluid nozzles 710. Each nozzle of the second plurality of fluid nozzles may be positioned in line with a gap between two fluid nozzles of the first plurality of fluid nozzles 705. This may allow more uniform force against the substrate surface, while limiting interaction between fluid sprays. The pressure may be similar or different between the two pluralities of nozzles, which may account for spatial aspects to limit or prevent interference between the streams, while maximizing particle removal across the surface of the substrate. By also orienting the nozzles in the same angled direction, such as the second angle discussed above, the streams may have limited or no overlap between the first plurality of fluid nozzles and the second plurality of fluid nozzles.

Additionally, in some embodiments, the first plurality of fluid nozzles and the second plurality of fluid nozzles may be oriented along the same first angle as discussed above, or the first plurality of fluid nozzles may be oriented in a first direction across the substrate and the second plurality of fluid nozzles may be oriented in the opposite direction across the substrate. Additionally, in some embodiments the first plurality of fluid nozzles may be used to perform cleaning with a first fluid, and the second plurality of fluid nozzles may be used to perform cleaning with a second fluid, such as subsequent cleaning after the first fluid delivery has been halted. This may limit contamination of fluid lines, and may improve throughput in some embodiments of the present technology. Two fluid reservoirs may be used and coupled through the span to the separate sets of nozzles to accommodate such configurations.

Figure 8:
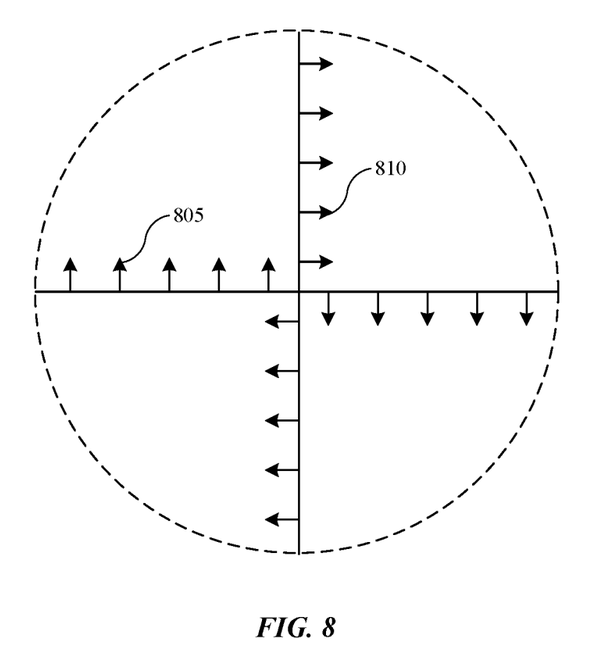
FIG. 8 shows a schematic view of exemplary nozzle orientations according to some embodiments of the present technology.

FIG. 8 shows a schematic view of exemplary nozzle orientations according to some embodiments of the present technology, and may illustrate configurations incorporating a first plurality of fluid nozzles 805 and a second plurality of fluid nozzles 810, both shown as the direction in which fluid delivery may occur, such as along a second angle, and which may be augmented by a first angle as previously described. FIG. 8 may illustrate an embodiment in which multiple spans may be used, and which may each include a plurality of fluid nozzles as previously described. As illustrated, a first span may be oriented in a first direction, and may include a first plurality of fluid nozzles 805 disposed along the span in a line in the first direction, and which may be reversed about the center of the span. Additionally, a second span may be oriented in a second direction normal to the first direction, and may include a second plurality of fluid nozzles 810 disposed along the span in a line in the second direction, and which may also be reversed about the center of the span. Although the first plurality of fluid nozzles and the second plurality of fluid nozzles may deliver the same fluids, including simultaneously, in some embodiments, the first plurality of fluid nozzles may be used to perform cleaning with a first fluid, and the second plurality of fluid nozzles may be used to perform cleaning with a second fluid different from the first.

Figure 9:
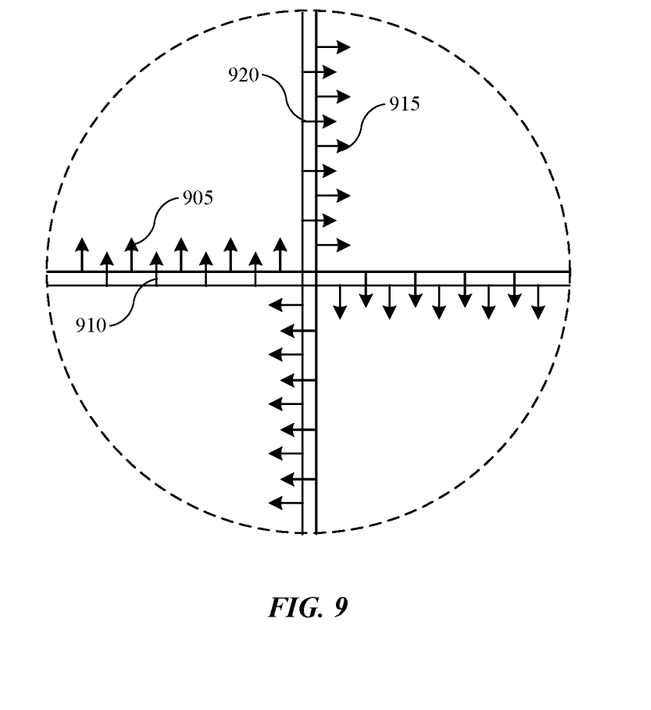
FIG. 9 shows a schematic view of exemplary nozzle orientations according to some embodiments of the present technology.

FIG. 9 shows a schematic view of exemplary nozzle orientations according to some embodiments of the present technology, and may illustrate configurations incorporating a combination of nozzle configurations, such as including nozzles as shown in FIG. 7, as well as nozzles as shown in FIG. 8. For example, a first plurality of fluid nozzles may include nozzles 905 and nozzles 910, both shown as the direction in which fluid delivery may occur, such as along a second angle, and which may be augmented by a first angle as previously described. The configuration also includes a second plurality of fluid nozzles that may include nozzles 905 and nozzles 910, both shown as the direction in which fluid delivery may occur, such as along a second angle, and which may be augmented by a first angle as previously described.

Additionally, the figure may illustrate an embodiment in which multiple spans may be used, and which may each include a plurality of fluid nozzles as previously described. As illustrated, a first span may be oriented in a first direction, and may include the first plurality of fluid nozzles including nozzles 905 and 910 disposed along the span in a line in the first direction, and which may be reversed about the center of the span. Additionally, a second span may be oriented in a second direction normal to the first direction, and may include the second plurality of fluid nozzles including nozzles 915 and 920 disposed along the span in a line in the second direction, and which may also be reversed about the center of the span. Although the first plurality of fluid nozzles and the second plurality of fluid nozzles may deliver the same fluids, including simultaneously, in some embodiments nozzles 905 from the first plurality of fluid nozzles and nozzles 915 from the second plurality of fluid nozzles may be used to perform cleaning with a first fluid, and nozzles 910 from the first plurality of fluid nozzles and nozzles 920 from the second plurality of fluid nozzles may be used to perform cleaning with a second fluid different from the first. By utilizing cleaning systems and performing methods according to embodiments of the present technology incorporating angled nozzles, improved cleaning may be performed across a range of substrates to reduce particle incorporation and contamination compared to conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a nozzle" includes a plurality of such nozzles, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A cleaning chamber comprising:
a substrate support comprising a substrate seating position; and
a plurality of fluid nozzles facing the substrate support, wherein each fluid nozzle of the plurality of fluid nozzles is aligned and is angled relative to the substrate seating position of the substrate support, each fluid nozzle delivering a fluid in a non-overlapping respective spray pattern characterized by a leading edge and a trailing edge, wherein each leading edge of each non-overlapping respective spray pattern contacts the substrate at an interior angle of greater than or about 90°.

2. The cleaning chamber of claim 1, wherein each fluid nozzle is operable to deliver a fluid at greater than or about 500 psi.

3. The cleaning chamber of claim 1, wherein the plurality of fluid nozzles is a first plurality of fluid nozzles, and wherein the cleaning chamber comprises a second plurality of fluid nozzles.

4. The cleaning chamber of claim 3, wherein the first plurality of fluid nozzles is directed towards the substrate seating position in a first direction, and wherein the second plurality of fluid nozzles is directed towards the substrate seating position in a second direction opposite the first direction.

5. The cleaning chamber of claim 3, wherein each fluid nozzle of the first plurality of fluid nozzles is separated from each adjacent fluid nozzle of the first plurality of fluid nozzles by a gap, and wherein each fluid nozzle of the second plurality of fluid nozzles is positioned in line with a gap between two fluid nozzles of the first plurality of fluid nozzles.

6. The cleaning chamber of claim 3, wherein each fluid nozzle of the first plurality of fluid nozzles is disposed along a line in a first direction across the cleaning chamber, and wherein each fluid nozzle of the second plurality of fluid nozzles is disposed along a line in a second direction across the cleaning chamber normal to the first direction.

7. The cleaning chamber of claim 3, further comprising:
a first cleaning fluid reservoir fluidly coupled with the first plurality of fluid nozzles within the cleaning chamber; and
a second cleaning fluid reservoir fluidly coupled with the second plurality of fluid nozzles within the cleaning chamber.

8. The cleaning chamber of claim 7, wherein the first cleaning fluid reservoir comprises a first cleaning fluid, and wherein the second cleaning fluid reservoir comprises a second cleaning fluid different from the first cleaning fluid.

9. The cleaning chamber of claim 1, wherein each fluid nozzle of the plurality of fluid nozzles defines a fluid port; and wherein each fluid port is characterized by a slit opening.

10. A method of substrate cleaning comprising:
positioning a substrate in a substrate cleaning chamber; and
spraying a cleaning fluid, according to a non-overlapping spray pattern, at the substrate from a plurality of fluid nozzles within the substrate cleaning chamber, wherein each fluid nozzle of the plurality of fluid nozzles is angled relative to the substrate such that a leading edge of the non-overlapping spray pattern contacts the substrate at an interior angle greater than or about 90°.

11. The method of substrate cleaning of claim 10, further comprising:
rotating the substrate within the substrate cleaning chamber while spraying the cleaning fluid.

12. The method of substrate cleaning of claim 11, wherein the cleaning fluid is sprayed at a fluid pressure of less than or about 250 psi.

13. The method of substrate cleaning of claim 11, further comprising:
reversing a direction of rotation, and
continuing to spray the cleaning fluid at the substrate.

14. The method of substrate cleaning of claim 10, wherein the cleaning fluid is sprayed at a fluid pressure of greater than or about 500 psi.

15. The method of substrate cleaning of claim 10, wherein the cleaning fluid comprises deionized water, hydrofluoric acid, or ammonium hydroxide.

16. The method of substrate cleaning of claim 10, wherein the cleaning fluid comprises a first cleaning fluid, the method further comprising:
halting spray of the first cleaning fluid; and
spraying a second cleaning fluid at the substrate.

17. The method of substrate cleaning of claim 16, wherein the plurality of fluid nozzles is a first plurality of fluid nozzles, and wherein the second cleaning fluid is sprayed from a second plurality of fluid nozzles.

18. The method of substrate cleaning of claim 17, wherein each fluid nozzle of the first plurality of fluid nozzles is disposed along a line in a first direction across the substrate cleaning chamber, and wherein each fluid nozzle of the second plurality of fluid nozzles is disposed along a line in a second direction across the substrate cleaning chamber normal to the first direction.

19. A cleaning chamber comprising:
a substrate support comprising a substrate seating position; and
a plurality of fluid nozzles facing the substrate support, wherein each fluid nozzle of the plurality of fluid nozzles is aligned and defines a fluid port characterized by a non-overlapping spray pattern having a leading edge and a trailing edge, and wherein each fluid nozzle of the plurality of fluid nozzles is angled relative to the substrate seating position of the substrate support so the leading edge of each non-overlapping spray pattern of the fluid port of each fluid nozzle of the plurality of fluid nozzles intersects the substrate at an interior angle of greater than or about 90°.

20. The cleaning chamber of claim 19, wherein the substrate support comprises a rotatable drum, and wherein the plurality of fluid nozzles is coupled along a sidewall of the cleaning chamber outside of the rotatable drum, and wherein each fluid nozzle is operable to deliver a fluid at greater than or about 500 psi.

* * * * *